United States Patent

[11] 3,588,882

[72] Inventor John A. Propster
La Mirada, Calif.
[21] Appl. No. 847,089
[22] Filed Aug. 4, 1969
[45] Patented June 28, 1971
[73] Assignee Hughes Aircraft Company
Culver City, Calif.

[54] DIGITAL-TO-ANALOG CONVERTER
12 Claims, 2 Drawing Figs.

[52] U.S. Cl. .......... 340/347
[51] Int. Cl. .......... H03k 13/02, H03k 13/04
[50] Field of Search .......... 340/347

[56] References Cited

UNITED STATES PATENTS

| | | | |
|---|---|---|---|
| 3,366,947 | 1/1968 | Kawashima .......... | 340/347 |
| 3,372,265 | 3/1968 | Gordon .......... | 340/347 |
| 3,403,393 | 9/1968 | Skrenes .......... | 340/347 |

*Primary Examiner*—Maynard R. Wilbur
*Assistant Examiner*—Jeremiah Glassman
*Attorneys*—James K. Haskell and Bernard P. Drachlis

ABSTRACT: A digital-to-analog converter including a register, a resistive network, and an amplifier circuit. The register includes a first set of flip-flops that provides digital output signals in a repetitious, ascending order, binary count sequence and a second set of flip-flops that provides individual output signals corresponding to the individual repetitions of the first set of flip-flops. The resistive network includes a plurality of binary weighted resistors that are coupled to receive the output signals provided by the first set of flip-flops and a plurality of equally weighted resistors that are coupled to receive the output signals provided by the second set of flip-flops. All but one of the binarily weighted resistors have a common output terminal for providing a first summing signal and all of the equally weighted resistors and one of the binarily weighted resistors have a common output terminal for providing a second summing signal. An amplifier circuit is coupled to receive the first summing signal and the second summing signal for providing an analog output signal being differentially related to the received summing signals.

INVENTOR.
JOHN A. PROPSTER,
BY
Frank E. Stevens Jr.
AGENT.

DIGITAL-TO-ANALOG CONVERTER

BACKGROUND OF THE INVENTION

This invention relates, in general, to a digital-to-analog converter and, more particularly, to a digital-to-analog converter for minimizing errors in the output signal due to switching transients.

Heretofore, to convert a binary number to an analog signal resistor, divider networks have been coupled to receive output signals provided by a register having a plurality of stages of memory elements, or flip-flops, which store a digital number. The resistor divider network includes a plurality of resistors that can be weighted so that the output of each of the stages in the register will contribute to the output voltage in proportion to the binary weight of individual resistors in the resistor network. This binary signal to the divider network determines the value of the analog output signal, since the divider network is a passive element. However, because digital voltage levels are not usually as precise as required in an analog system, level amplifiers, or switches, are generally placed between the register and the divider network. The level amplifiers, or switches, switch the output of individual resistors in the divider network between ground and a reference voltage.

The digital-to-analog converter output can contain transients, if many bits change stages simultaneously. For example, in switching from a binary number, such as 0111, to a binary number 1000, all of the flip-flops in the register change state. Even though the corresponding two values of the analog voltage are very close, the transients occur on the resistor divider output for the following reasons: variation in transient times of the flip-flops; transient current draw from the reference supply; the fact that the flip-flops have a slower fall time than rise time; and the fact that the signals must propagate through the divider network. The largest error due to switching is generally from midscale to one count less or from one count below midscale to midscale.

SUMMARY OF THE INVENTION

An object of this invention is to provide an improved digital-to-analog converter that has the advantage of substantially reducing errors in output signals due to the changing of electrical state of the components.

Another object of this invention is to provide an improved digital-to-analog converter that has the advantage of eliminating the requirement for precision switches.

The above and other objects of this invention can be attained by a circuit including a register, a resistive network and an operational amplifier. The register is coupled to receive logic input signals and clock pulse signals for providing digital output signals in response to the received signals. The register includes a plurality of memory elements, or flip-flops, that can be selected to have substantially the same turnoff times and have substantially the same turn-on times and which are individually coupled to receive the logic input signals and the clock pulse signals for providing digital output signals. A first set of flip-flops provides digital output signals in a repetitious, ascending order, binary count sequence from a first repetition to an *n*th repetition. Individual ones of a second set of flip-flops provide an output signal at the cessation of the individual repetitions of the first set of flip-flops.

The resistive network includes a plurality of binary weighted resistors and a plurality of equally weighted resistors and a bias resistor. The plurality of binary weighted resistors are individually coupled to receive the output signals provided by all but one of the flip-flops of the first set of flip-flops. The plurality of equally weighted resistors are individually coupled to receive individual output signals provided by the second set of flip-flops and the output provided by one of the flip-flops of the first set of flip-flops. The outputs of the all but one of binary weighted resistors are coupled together for providing a first summing signal related to the accumulated binary weight of the binary weighted resistors receiving digital signals from the register. The output set of equally weighted resistors and one of the binary weighted resistors and the bias resistor are coupled together for providing a second summing signal related to the accumulative weight of the resistors receiving a digital signal from the register and the bias register.

DESCRIPTION OF THE PREFERRED EMBODIMENT

Figure 1:
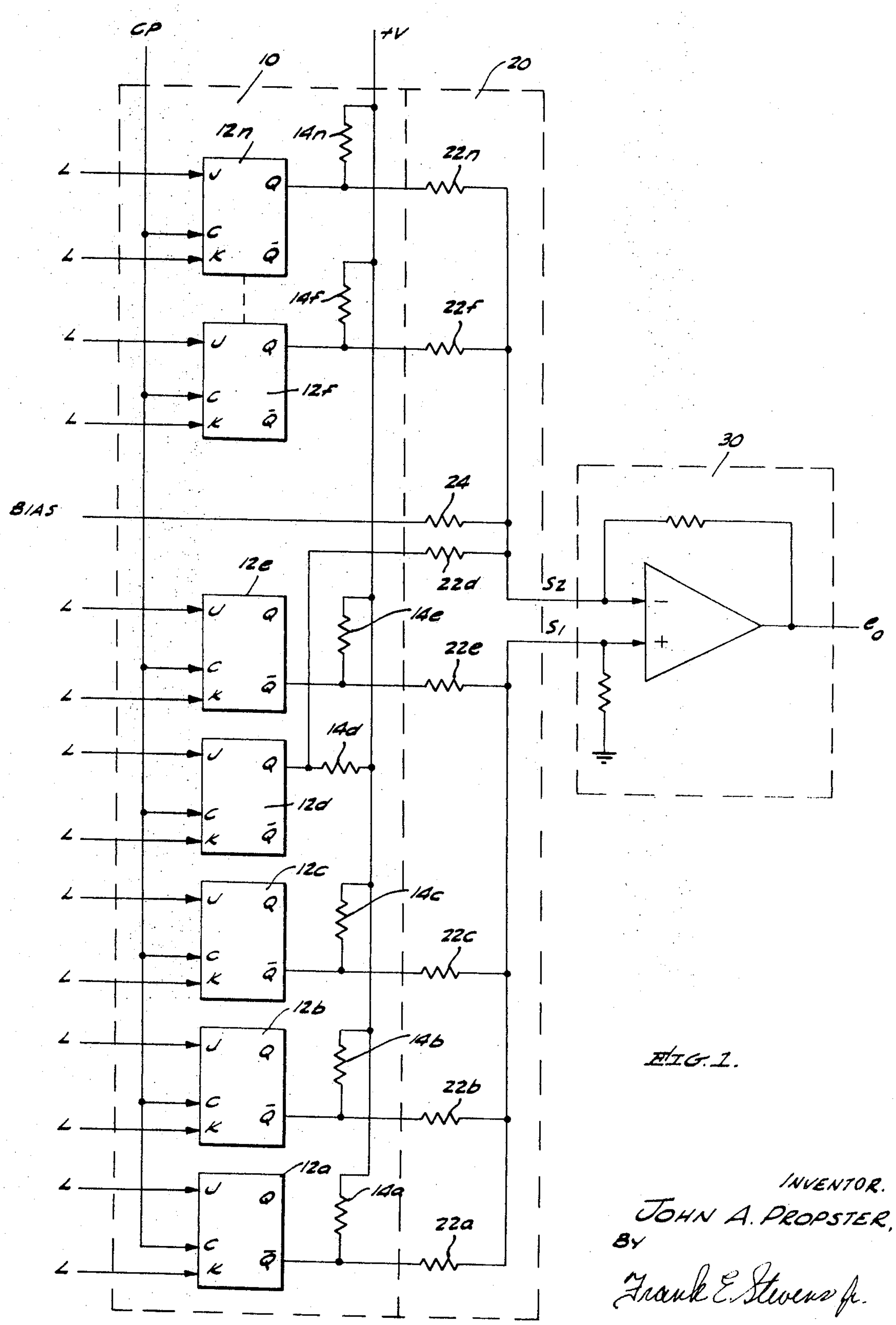

Referring now to the drawings wherein like reference characters designate like or corresponding parts, there is shown in FIG. 1 a register 10, a resistive network 20 and an operational amplifier 30.

The register 10 includes a plurality of memory elements, or flip-flops, **12*a*—12*n*** (where *n* is any integer representing an *n*th stage) that are individually coupled to receive clock pulse signals, CP, at a clock input terminal C and logic signals L at a J and a K input terminal for providing digital output signals in response to the received signal. The outputs of flip-flops **12*a*—12*c* and 12*e* are provided by the $\bar{Q}$ output terminal, and the outputs of the flip-flops 12*d* and 12*f*—12*n*** are provided by the Q output terminal.

The plurality of flip-flops **12*a*—12*n*** can be J–K flip-flops, such as SHUL II, SF110/130 J–K flip-flops that are manufactured by Sylvania and described in their report, New Product Report, June 1, 1967. J–K flip-flops of the type referred to above operate such that the Q output of the flip-flop will change from the high state to the low state if the J input terminal is high and a clock pulse signal is received, and from the low state to the high state if the K input terminal is high and a clock pulse signal is received. The above-described and other logic is illustrated by the following truth table:

| J | K | $Q_n$ | $Q_n+1$ |
|---|---|---|---|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |

The above-referenced flip-flops can have a turnoff delay when the output of the flip-flop changes from the zero, or low state, to the one, or high state, and a turn-on delay when the output of the flip-flops change from the one, or high state, to the zero, or low state. The turnoff delay is the duration of time from the time a negative-going edge of a clock pulse signal CP is received until the output changes from the minimum output value to the maximum output value. The turn-on delay is the duration of time from the time a negative-going edge of a clock pulse signal is received until the output changes from the maximum output value to the minimum output value. The turnoff delay is generally shorter in duration than the turn-on delay. Furthermore, the plurality of flip-flops **12*a*—12*n*** can be selected to have the same turn-on delay and the same turnoff delay. However, the turnoff delay and the turn-on delay cannot be precisely equal under the present manufacturing techniques.

One output of each of the plurality of flip-flops **12*a*—12*n*** is further coupled to a positive voltage terminal +*v* through individual coupling or pullup resistors **14*a*—14*n* for coupling and decoupling the outputs between ground and the positive voltage terminal. When using flip-flops of the type referred to above, when the output of an individual one of the plurality of flip-flops 12*a*—12*n*** is low, the positive voltage +*v* is effectively coupled to ground through the respective flip-flop. However, when the output of an individual one of the plurality of flip-flops is high, the positive voltage is decoupled from ground and provides an output signal approximately equal to the positive voltage +*v*. The applying of the positive voltage +*v* to the output of the individual flip-flops **12*a*—12*n* through the individual coupling resistors 14*a*—14*n* has the advantage of eliminating the need for precision switches between the output of the register 10 and the resistive network 20 by providing a constant voltage at the outputs of the flip-flops 12*a*—12*n*** when the outputs are high to eliminate internal variations of the particular flip-flops.

The resistive network 20 includes a plurality of binary weighted resistors 22*a*—22*e*, a plurality of equally weighted resistors 22*f*—22*n* and a bias resistor 24. Each of the weighted resistors 22*a*—22*n* has a first end coupled to one output of individual ones of the plurality of flip-flops 12*a*—12*n* and a second end connected together in two separate groups. A first group of resistors including binary weighted resistors 22*a*—22*c* and 22*e* have their first end coupled to the $\overline{Q}$ output of flip-flops 12*a*—12*c* and 12*e*, respectively, and have the second end coupled together in common circuit relationship to provide a first summing signal $S_1$ equal to the summation of the first group of the received signals. A second group of resistors, including binary weighted resistor 22*d* and equally weighted resistors 22*f*—22*n* and 24, have their first end coupled to the Q output of flip-flops 12*d*and 12*f*—12*n*, and have their second end coupled together in common circuit relationship to provide a second summing signal $S_2$ equal to the summation of the second group of the received digital signals. In addition, a bias resistor 24 has a first end connected to a bias voltage and a second end connected in common circuit relationship with the second ends of the second group of resistors 22*d* and 22*f*—22*n*

Binary weighted resistors 22*a*—22*e* are weighted to provide output signals at their second end having values related to a binary weight of 1, 2, 4, 8, and 16, respectively, in response to digital output signals provided by flip-flops 12*a*—12*e*. For example, the output of the resistors 22*a*—22*e* can be 0.015 v., 0.030 v., 0.060 v., 0.12 v. and 0.24 v., respectively. The equally weighted resistors 22*f*—22*n* are weighted to provide individual output signal having a value related to a binary weight of 32 in response to receiving the digital output signal from individual ones of flip-flops 12*f*—12*n*. For example, the output of individual ones of the flip-flops 12*f*—12*n* can be 0.32 v. The bias resistor 24 is weighted to provide an output signal related to a binary weight of 23. For example, the output of the bias resistor 24 can be 0.23 v.

The operational amplifier 30 is coupled to receive the first summing signal $S_1$ and the second summing signal $S_2$ for providing an output signal having a value related to the voltage difference between the received signals. Operationally, the inverting input (−) of the operational amplifier is maintained either equal to or more positive than the noninverting input (+) by either increasing the value of the second summing signal $S_2$ or by decreasing the value of the first summing signal $S_1$ or both.

The operational amplifier 30 can be a μA709 HIGH PERFORMANCE OPERATIONAL AMPLIFIER, manufactured by Fairchild Semiconductor Corporation and described in their handbook, "*Fairchild Semiconductor Linear Integrated Circuits Handbook*," 1967, pages 57 through 72.

An operational amplifier of the type referred to above has an inverting input (−) and a noninverting input (+), and operates such that if a positive voltage is applied to the inverting input (−), a negative output signal will be produced, while a positive voltage signal applied to the noninverting input (+) produced a positive output signal. Furthermore, if the amplifier is operated having signals applied to both the inverting input (−) and the noninverting input (+), it will provide an output signal related to the voltage difference between the received signals.

Referring now to the operation of the circuit illustrated in FIG. 1 and to the waveforms illustrated in FIG. 2, the plurality of flip-flops 12*a*—12*n* provide output signals according to the following truth table in response to the corresponding input signal.

| Input Signal | $Q_{12n}$ | --- | $Q_{12f}$ | $\overline{Q}_{12e}$ | $Q_{12d}$ | $\overline{Q}_{12c}$ | $\overline{Q}_{12b}$ | $\overline{Q}_{12a}$ |
|---|---|---|---|---|---|---|---|---|
| 0 | 0 | | 0 | 1 | 0 | 1 | 1 | 1 |
| 1 | 0 | | 0 | 1 | 0 | 1 | 1 | 0 |
| 2 | 0 | | 0 | 1 | 0 | 1 | 0 | 1 |
| 3 | 0 | | 0 | 1 | 0 | 1 | 0 | 0 |
| 4 | 0 | | 0 | 1 | 0 | 0 | 1 | 1 |
| 5 | 0 | | 0 | 1 | 0 | 0 | 1 | 0 |
| 6 | 0 | | 0 | 1 | 0 | 0 | 0 | 1 |
| 7 | 0 | | 0 | 1 | 0 | 0 | 0 | 0 |
| 8 | 0 | | 0 | 1 | 1 | 1 | 1 | 1 |
| 9 | 0 | | 0 | 1 | 1 | 1 | 1 | 0 |
| - | | | | | | | | |
| - | | | | | | | | |
| 15 | 0 | | 0 | 1 | 1 | 0 | 0 | 0 |
| 16 | 0 | | 0 | 0 | 0 | 1 | 1 | 1 |
| 17 | 0 | | 0 | 0 | 0 | 1 | 1 | 0 |
| - | | | | | | | | |
| - | | | | | | | | |
| 31 | 0 | | 0 | 0 | 1 | 0 | 0 | 0 |
| 32 | 0 | | 1 | 1 | 0 | 1 | 1 | 1 |
| 33 | 0 | | 1 | 1 | 0 | 1 | 1 | 0 |
| - | | | | | | | | |
| - | | | | | | | | |
| 63 | 0 | | 1 | 0 | 1 | 0 | 0 | 0 |
| 64 | 0 | | 1 | 1 | 0 | 1 | 1 | 1 |
| 65 | 0 | | 1 | 1 | 0 | 1 | 1 | 0 |
| - | | | | | | | | |
| - | | | | | | | | |
| 95 | 0 | | 1 | 0 | 1 | 0 | 0 | 0 |
| 96 | 0 | | 1 | 1 | 0 | 1 | 1 | 1 |
| 97 | 0 | | 1 | 1 | 0 | 1 | 1 | 0 |
| - | | | | | | | | |
| - | | | | | | | | |
| 127 | 0 | | 1 | 0 | 1 | 0 | 0 | 0 |
| 128 | 0 | | 1 | 1 | 0 | 1 | 1 | 1 |
| 129 | 0 | | 1 | 1 | 0 | 1 | 1 | 0 |
| - | | | | | | | | |
| - | | | | | | | | |
| 159 | 0 | | 1 | 0 | 1 | 0 | 0 | 0 |
| 160 | 0 | | 1 | 1 | 0 | 1 | 1 | 1 |
| 161 | 0 | | 1 | 1 | 0 | 1 | 1 | 0 |
| - | | | | | | | | |
| - | | | | | | | | |
| - | | | | | | | | |
| 512 | 0 | | 1 | 1 | 0 | 1 | 1 | 1 |
| - | | | | | | | | |
| - | | | | | | | | |
| - | | | | | | | | |
| 960 | 0 | | 1 | 1 | 0 | 1 | 1 | 1 |
| 961 | 0 | | 1 | 1 | 0 | 1 | 1 | 0 |
| - | | | | | | | | |
| - | | | | | | | | |
| - | | | | | | | | |
| 991 | 0 | | 1 | 0 | 1 | 0 | 0 | 0 |
| 992 | 1 | | 1 | 1 | 0 | 1 | 1 | 1 |
| 993 | 1 | | 1 | 1 | 0 | 1 | 1 | 0 |
| - | | | | | | | | |
| - | | | | | | | | |
| - | | | | | | | | |
| 1022 | 1 | | 1 | 0 | 1 | 0 | 0 | 1 |
| 1023 | 1 | | 1 | 0 | 1 | 0 | 0 | 0 |

The flip-flops 12*a*—12*e* provide output signals in a repetitious, ascending order, binary count sequence, as illustrated in FIGS. 2A—2E in response to receiving corresponding logic signals. The flip-flops 12*f*—12*n* provide an output signal each time the output of the flip-flops 12*a*—12*e* counts from a binary 0 to a binary 32 and begins a new repetition after the first repetition. The voltage developed across the inverting input (−) and noninverting input (+) of the operational amplifier 30 for one repetition of the binary count 32 and possible errors that may be developed between the inverting (−) input and noninverting input (+) because of the turn-on delays of the flip-flops 12*a*—12*f* is illustrated in FIG. 2G. The waveforms of FIGS. 2A—2F further illustrate the turn-on delay of the outputs of the flip-flops 12*a*—12*f* when the output signals change from a high state to a low state.

For an all binary zero input signal to the register 10, the flip-flops 12*f*—12*n* and 12*d* provide no output signal and the outputs of the flip-flops 12*a*—12*c* and 12*e* are high and provide output signals which are applied to the binary weighted resistors 22*a*—22*c* and 22*e*, respectively, in the resistive network 20 which, in turn, provides the first summing signal $S_1$ having a binary weight of 23. The first summing signal $S_1$ which is applied to the noninverting input (+) is balanced by a voltage having a binary weight of 23 provided by the output of the bias resistor 24 which is applied to the inverting input (−) of the operational amplifier 30, resulting in a zero voltage difference between the inverting input (−) and the noninverting input (+). Accordingly, when there is zero voltage difference between the inverting input (−) and the noninverting input (+) of the operational amplifier 30, a zero output voltage $e_o$ will result. The output voltage $e_o$ of the operational amplifier for a binary zero input signal can be represented by the following equation:

$$e_o = -(16\,\overline{Q}_{12e} + 4\,\overline{Q}_{12c} + 2\,\overline{Q}_{12b} + 1\,\overline{Q}_{12a}).$$

As the logic input signal changes from all zeros, the binary number input increases, and the flip-flops 12a—12e change state, as illustrated in FIGS. 2A—2E and provide digital output signals in a repetitious, ascending order, binary count sequence from a binary zero to a binary 31. Each time the outputs of the flip-flops 12a—12e return to a binary zero after the first repetition, the output of the flip-flops 12f—12n changes from the low state to the high and provides an output signal. The sequence of providing output signals from one of the flip-flops 12f—12n is repeated with the initiation of each repetition of the count from a binary one to a binary 31 of the output of the flip-flops 12a—12e until all of the flip-flops 12f—12n provide an output signal. When an output signal is being provided by the output of all of the flip-flops 12f—12n, when the next clock pulse is received, the outputs of all of the plurality of flip-flops 12a—12n return to the initial state for a binary zero, and the count sequence repeats.

Figures 2A, 2B, 2C, 2D, 2E, 2G, 12F:
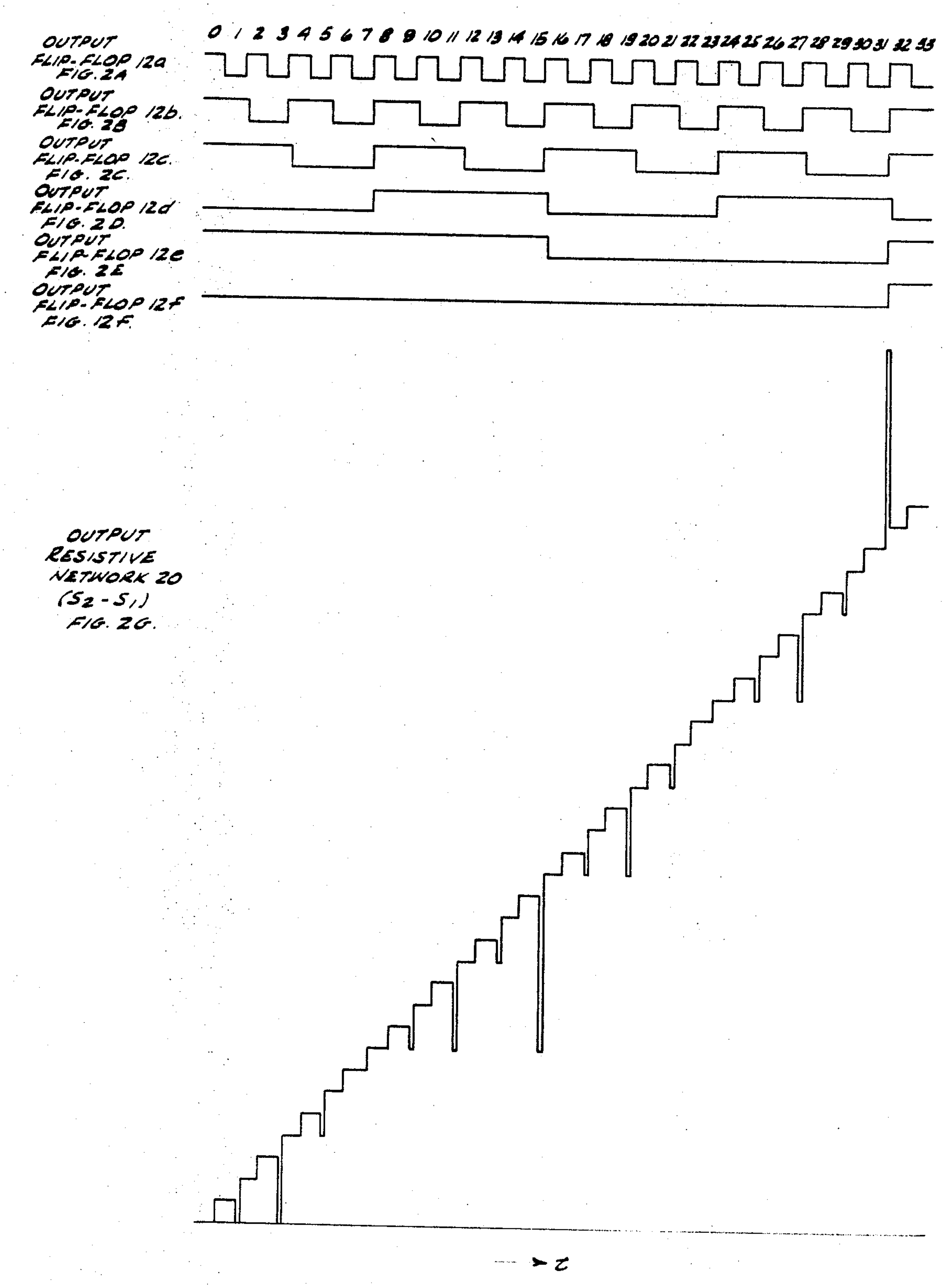

Neglecting errors due to the turn-on time of the outputs of the flip-flop 12a, no errors in output signal will result, as long as the outputs of all of the plurality of flip-flops 22a—22n change state in the same direction; that is, all the outputs change from the low stage to the high state, or from the high state to the low state. However, when the outputs of some of the plurality of flip-flops 12a—12n change to a high state, and the output of at least one of the plurality of flip-flops 12a—12n changes from a high state to a low state, an error in the output signal may result for a short duration of time, due to the differences in turnoff times and turn-on times of the respective flip-flops, as illustrated in FIG. 2G. For example, at the initiation of a binary 4, 12, 20... , an error will result, due to the turn-on delay of the output of the flip-flop 12e, and at the initiation of a binary 16, 32 ... , an error will result due to the turn-on delay of the output of the flip-flop 12d.

The largest error that may result will be at the initiation of the binary 16 and at the initiation of a binary 32 and multiples thereof, as illustrated in FIG. 2G. At the initiation of a binary 16, the output of the flip-flops 12a—12c change from a low state to a high state and the outputs of the flip-flops 12d and 12e change form a high state to a low state. Consequently, the output of the flip-flops 12d and 12e have a turn-on delay and the output of the flip-flops 12d and 12e will remain high for a short duration of time while the outputs of the flip-flops 12a—12c are high. As a result, a negative error equivalent to eight least significant bits (LSB) may result. This error will be present until the outputs of the flip-flops 12d and 12e change to the low state.

When the binary input signal increases from a binary 31 to a binary 32, the outputs of the flip-flops 12a—12c and 12e and the flip-flop 12f change from a low state to a high state and the output of the flip-flop 12d changes from a high state to a low state. Accordingly, the output of the flip-flop 12d will remain high for a short duration of time, while the outputs of the flip-flops 12a—12c and 12e are high and an output error of positive eight least significant bits (LSB) may result until the output of the flip-flop 12d changes to the low state, as illustrated in FIG. 2G.

As illustrated in FIG. 2G, when the input signal changes from a binary 31 to a binary 32, the outputs of the flip-flops 12a—12 return to their initial setting for a binary zero input signal and the second summing signal $S_2$ is comprised of the output of flip-flop 12f and the bias voltage signal and the first summing signal $S_1$ is comprised of the outputs of the flip-flops 12a—12 and 12e.

As the binary number input signal increases, the operation of the circuit of FIG. 1 is repeated for each repetition of an increase of 31 (LSB) in the binary input signal. The largest error that will result will be an eight least significant digit error. If conventional digital-to-analog converter techniques are used, larger errors could result. For example, if a 10 digit binary number is converted by conventional means, from a binary 511 or 0111111111 to a binary 512 or 1000000000, an error of 511 least significant digits could result because the nine bits that are changing from a binary one to a binary zero will have a turn-on delay which will cause them to remain in the high state for a short duration of time when the most significant bit is changing from a binary zero to a binary one.

While the salient features have been illustrated and described with respect to a particular embodiment, it should be readily apparent that modifications can be made within the spirit and scope of the invention.

I claim:

1. A digital-to-analog converter, comprising:

a first set of memory elements, each of said first set of memory elements being coupled to receive logic input signals for providing digital output signals in a repetitious ascending order binary sequence in response to the received logic input signals;

a second set of memory elements, individual ones of said second set of memory elements being coupled to receive logic input signals for providing output signals at the cessation of the individual repetition of the output signals of said first set of memory elements;

a plurality of binary weighted resistors, individual ones of said plurality of binary weighted resistors having a first end coupled to receive the digital output signal provided by individual ones of said first set of memory elements and having a second end connected together for providing a first summing signal related to the summation of the binary weight of said plurality of binary weighted resistors receiving digital output signals;

a plurality of equally weighted resistors, individual ones of said plurality of equally weighted resistors having a first end coupled to receive the output signal provided by individual ones of said second set of memory elements and having a second end connected in common circuit relationship with at least one of said binary weighted resistors for providing a second summing signal related to the summation of the individual equally weighted resistors and the binary weighted resistor receiving the digital signals; and means coupled to said weighted resistors and responsive to said first and said second summing signals for providing an output signal being a function of the difference between the magnitude of said summing signals.

2. The digital-to-analog converter of claim 1 that further includes a plurality of coupling resistors, individual ones of said plurality of coupling resistors having a first end coupled to the first end of individual ones of the plurality of weighted resistors and a second end coupled to a voltage source.

3. The digital-to-analog converter of claim 1 in which each of said plurality of memory elements are J–K flip-flops.

4. The digital-to-analog converter of claim 2 in which said memory elements are J–K flip-flops.

5. The digital-to-analog converter of claim 3 in which said J–K flip-flops have substantially the same turn-on delay and substantially the same turnoff delay.

6. The digital-to-analog converter of claim 4 in which said J–K flip-flops have substantially the same turn-on delay and substantially the same turnoff delay.

7. The digital-to-analog converter of claim 1 in which said means coupled to said weighted resistors for providing output signals is an operational amplifier.

8. The digital-to-analog converter of claim 2 in which said means coupled to said weighted resistors for providing output signals is an operational amplifier.

9. The digital-to-analog converter of claim 3 in which said means coupled to said weighted resistors for providing output signals is an operational amplifier.

10. The digital-to-analog converter of claim 4 in which said means coupled to said weighted resistors for providing output signals is an operational amplifier.

11. The digital-to-analog converter of claim 5 in which said means coupled to said weighted resistors for providing output signals is an operational amplifier.

12. The digital-to-analog converter of claim 6 in which said means coupled to said weighted resistors for providing output signals is an operational amplifier.

PO-1050
(5/69)

UNITED STATES PATENT OFFICE
CERTIFICATE OF CORRECTION

Patent No. 3,588,882 Dated June 28, 1971

Inventor(s) John A. Propster

It is certified that error appears in the above-identified patent and that said Letters Patent are hereby corrected as shown below:

Col. 4, line 75, "$e_o = -(16\bar{Q}_{12e} + 4\ \bar{Q}_{12c} + 2\ \bar{Q}_{12b} + 1\ \bar{Q}_{12a})$"

should be

--$e_o = 23 - (16\ \bar{Q}_{12e} + 4\ \bar{Q}_{12c} + 2\ \bar{Q}_{12b} + 1\ \bar{Q}_{12a})$--;

Col. 5, line 62, "12a-12" should be --12a-12e--;
line 65, "12a-12" should be --12a-12c--.

Signed and sealed this 26th day of September 1972.

(SEAL)
Attest:

EDWARD M.FLETCHER,JR.
Attesting Officer

ROBERT GOTTSCHALK
Commissioner of Patents